US006569702B2

(12) United States Patent
Cho et al.

(10) Patent No.: US 6,569,702 B2
(45) Date of Patent: May 27, 2003

(54) TRIPLE LAYER ISOLATION FOR SILICON MICROSTRUCTURE AND STRUCTURES FORMED USING THE SAME

(75) Inventors: Dong-il Cho, Seoul (KR); Sangwoo Lee, Seoul (KR); Sangjun Park, Seoul (KR)

(73) Assignee: Chromux Technologies, Inc., Chatsworth, CA (US)

( * ) Notice: Subject to any disclaimer, the term of this patent is extended or adjusted under 35 U.S.C. 154(b) by 26 days.

(21) Appl. No.: 09/885,832

(22) Filed: Jun. 19, 2001

(65) Prior Publication Data

US 2002/0001871 A1 Jan. 3, 2002

(30) Foreign Application Priority Data

Jul. 3, 2000 (KR) ......................................... 2000-37659

(51) Int. Cl.[7] .............................................. H01L 21/00
(52) U.S. Cl. ............................ 438/50; 438/52; 438/53; 438/411; 438/454; 438/619
(58) Field of Search ............................ 438/50, 52, 53, 438/411, 456, 619

(56) References Cited

U.S. PATENT DOCUMENTS 5,316,979 A * 5/1994 MacDonald et al. .......... 438/52
6,051,866 A * 4/2000 Shaw et al. .................. 257/417

* cited by examiner

Primary Examiner—Albert W. Paladini
Assistant Examiner—David A. Zarneke
(74) Attorney, Agent, or Firm—Hogan & Hartson, LLP

(57) ABSTRACT

An isolation method for a single crystalline silicon microstructure using a triple layer structure is disclosed. The method includes forming the triple layer composed of an insulation layer formed over an exposed surface of the silicon microstructure, a conductive layer formed over the entire insulation layer, and a metal layer formed over a top portion of the microstructure; and partially etching the conductive layer to form electrical isolation between parts of the microstructure. The method does not require a separate photolithography process for isolation, and can be effectively applied to microstructures having high aspect ratios and narrow trenches. Also disclosed are single crystalline silicon microstructures having a triple layer isolation structure formed using the disclosed method.

21 Claims, 11 Drawing Sheets

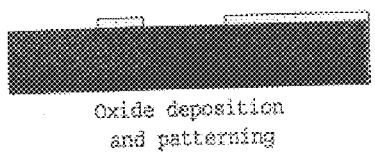
Fig. 1a Oxide deposition and patterning
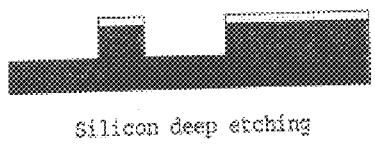
Fig. 1b Silicon deep etching
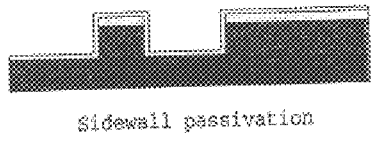
Fig. 1c Sidewall passivation
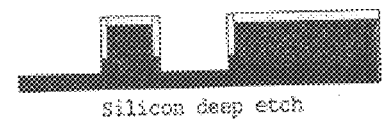
Fig. 1d Silicon deep etch
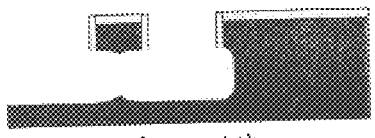
Fig. 1e Release etch
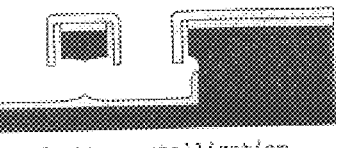
Fig. 1f Sputter metallization

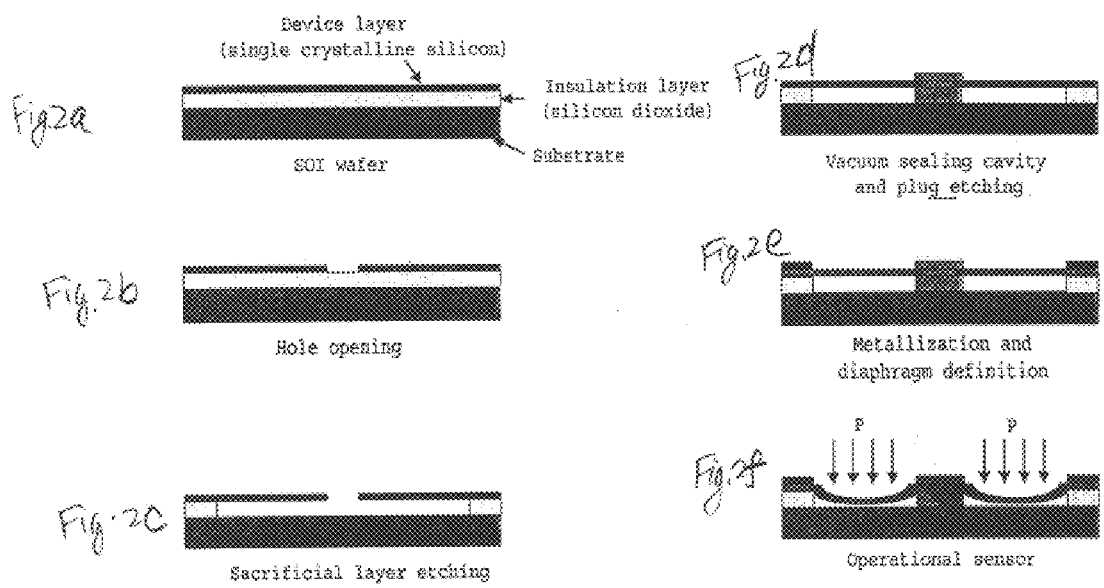

Fig. 3
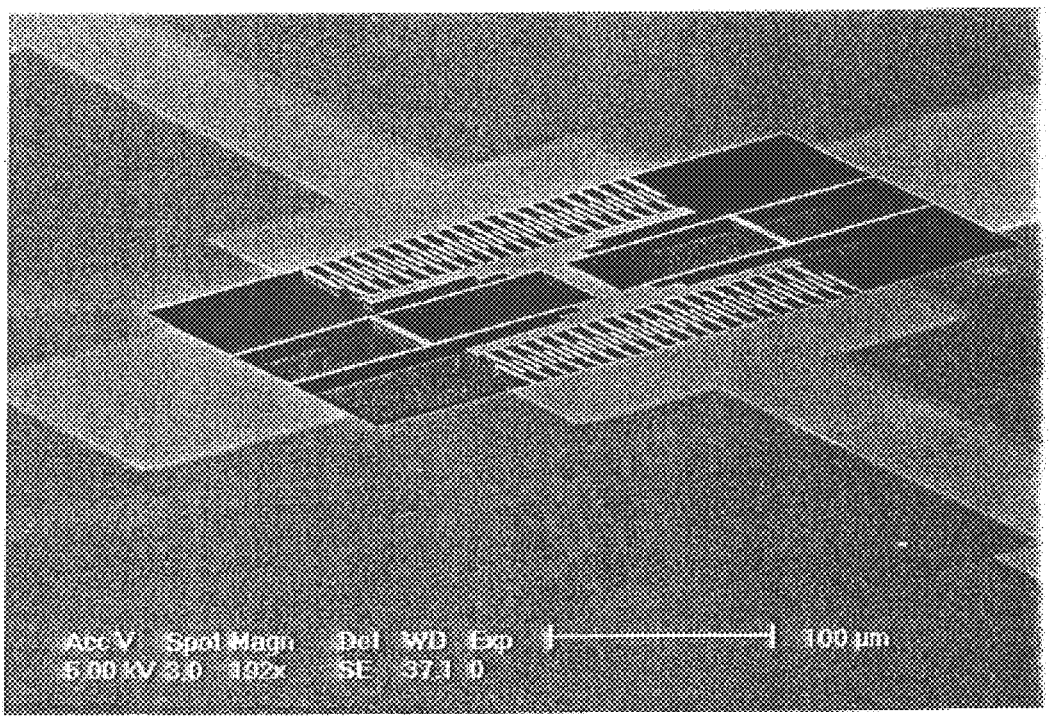
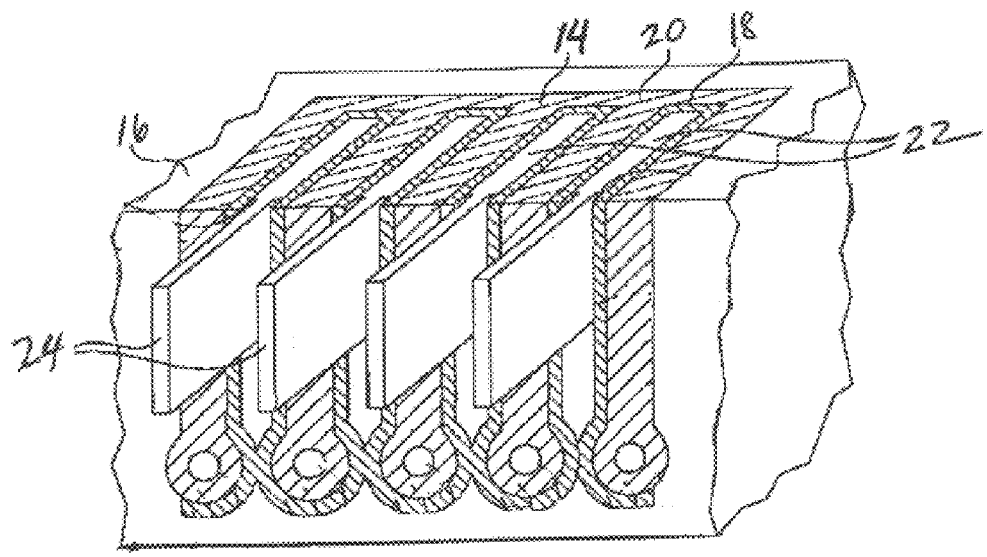
FIG. 4.

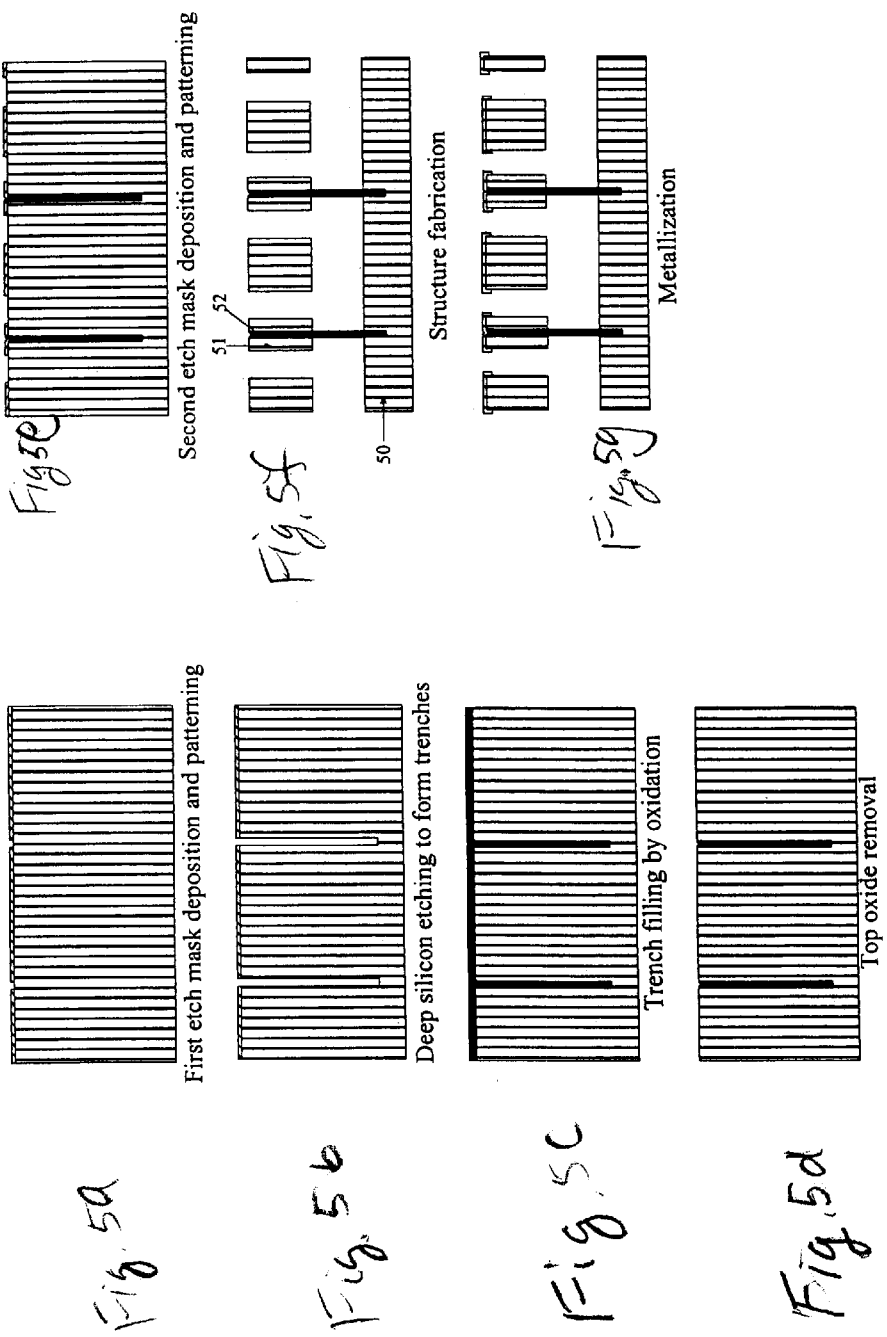

[Fig. 6a]
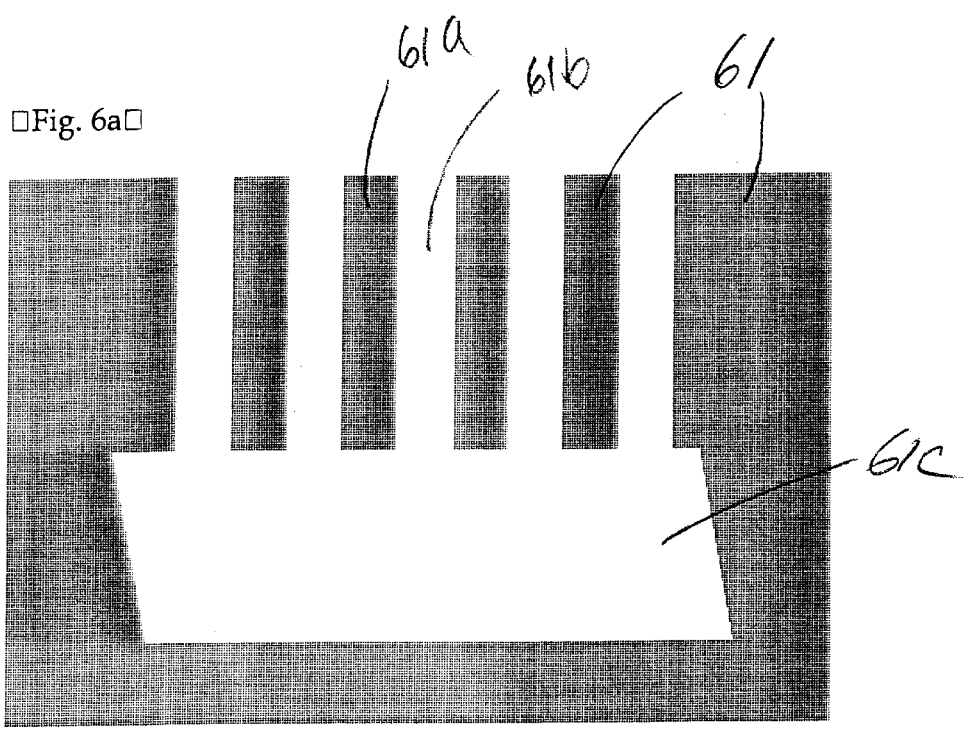
[Fig. 6b]
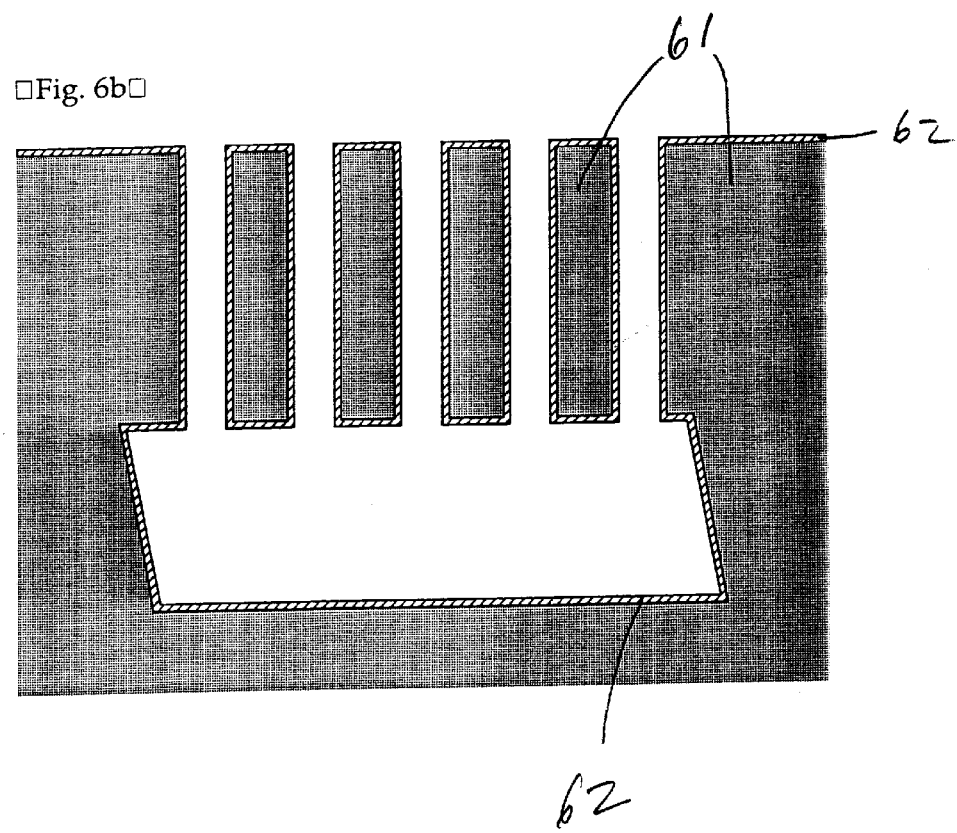

[Fig. 8a]
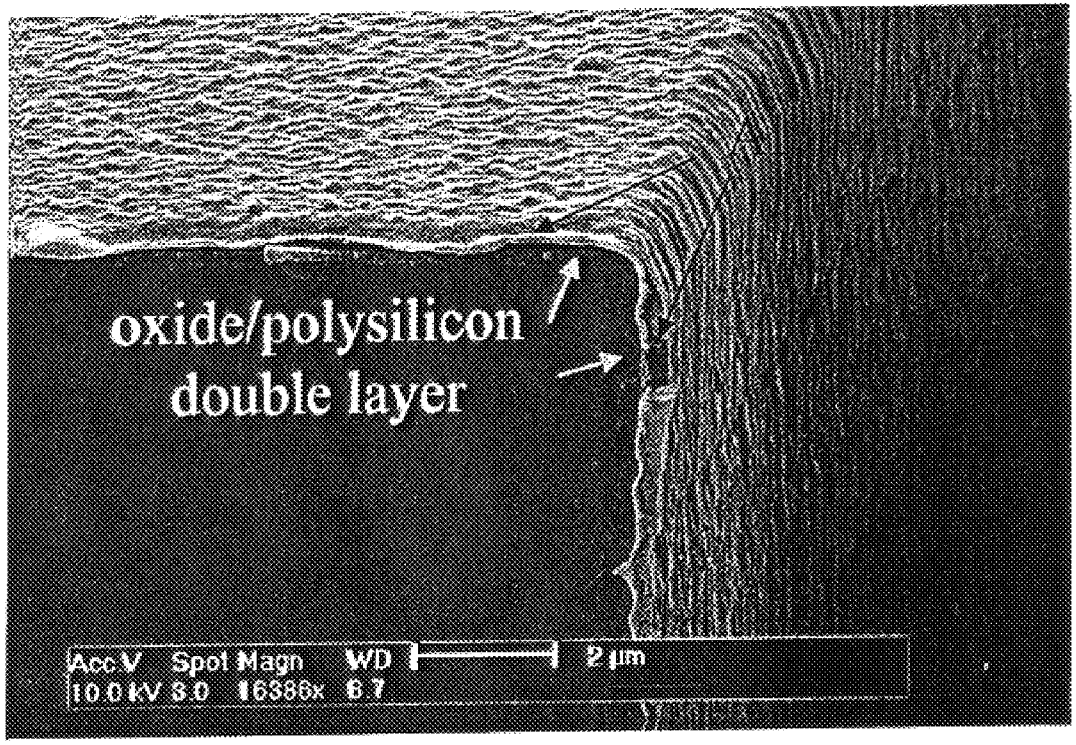
[Fig. 8b]
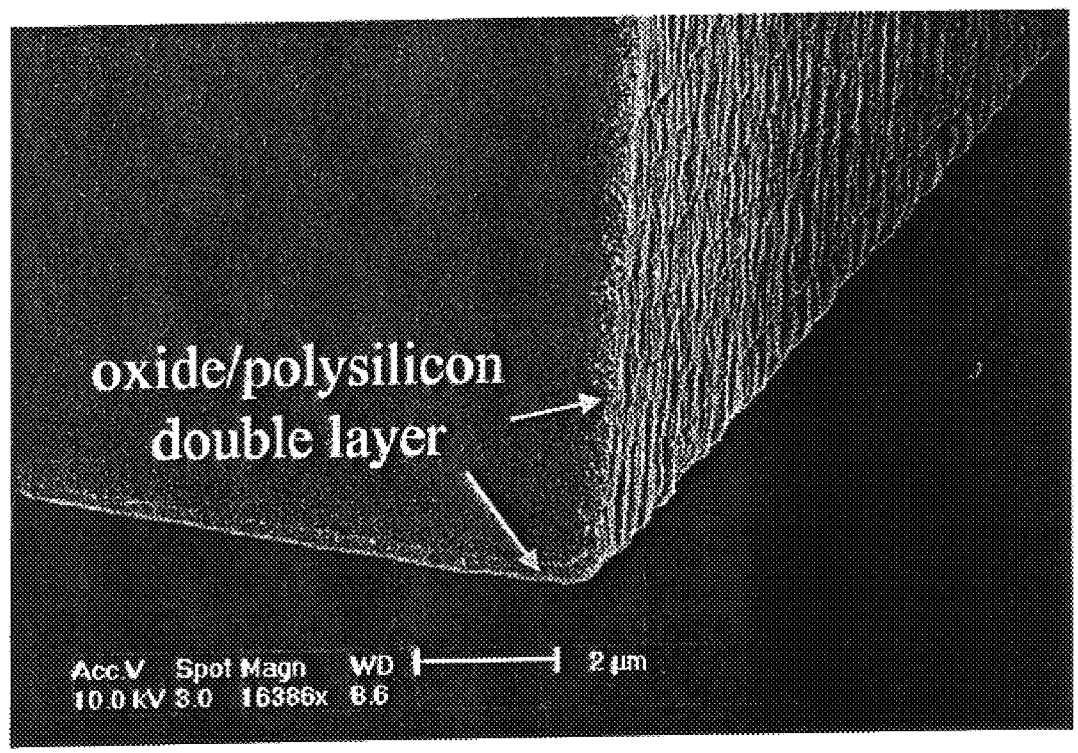

TRIPLE LAYER ISOLATION FOR SILICON MICROSTRUCTURE AND STRUCTURES FORMED USING THE SAME

The present application claims priority under 35 U.S.C. § 119 from Korean patent application No. 2000-37659, "Isolation Method for Single Crystalline Silicon Micro Structure Using Triple Layers," filed with the Korean Industrial Property Office on Jul. 3, 2000, which application is hereby incorporated by reference in its entirety.

BACKGROUND OF THE INVENTION

1. Field of the Invention

The present invention relates to micromachining and in particular to electrically isolating parts of silicon microstructures.

2. Description of the Related Art

Microelectromechanical systems include component structures with typical minimum dimensions on the order of a micron where the component structures can have elaborate shapes and perform a variety of complex functions. The component structures of microelectromechanical systems are formed on a semiconductor or glass substrate. Microelectromechanical systems include devices such as accelerometers that sense the acceleration of a moving object, gyroscopes that sense the angular rate of a rotating object and mirror arrays that deflect light in fiber optic communication and display applications. Micromachining techniques are used to fabricate the very small structures that are integrated with electrical parts on the semiconductor or glass substrate. The techniques used to fabricate these microelectromechanical systems are largely based on semiconductor device fabricating technology, including photolithography, thin film deposition, etching, impurity doping by diffusion and ion implantation, electroplating and wafer bonding.

Microelectromechanical systems often include moving parts that are suspended from or tethered to an underlying substrate and that can move independently of the underlying substrate. Microelectromechanical systems also include electrodes that are electrically isolated to allow the electrodes, for example, to measure electrical signals flowing in the moving parts of the system. Other types of electrodes are used to apply electrical signals to the moving parts of the system; these electrodes are generally electrically isolated. Electrodes have to be electrically isolated from one another, and also from the substrate on which the electrodes and the tethered moving parts are fabricated. Many methods for electrically isolating a part of a microelectromechanical system from other parts of the system have been studied.

FIGS. 1a–1f shows process steps in the conventional isolation process known as the single crystalline reactive etching and metallization (hereinafter, referred to as the "SCREAM") process. The SCREAM isolation process is performed on a structure fabricated by the SCREAM micromachining technique in the manner discussed in U.S. Pat. No. 5,563,343; U.S. Pat. No. 5,198,390; and K. A. Shaw, Z. L. Zhang, and N. C. MacDonald, "SCREAM I: A Single Mask, Single-Crystal Silicon, Reactive Ion Etching Process for Microelectromechanical Structures," *Sensors and Actuators A*, Vol. 40, pp. 63, 1994. Plasma enhanced chemical vapor deposition (hereinafter, "PECVD") covers all surfaces of a micromachined structure with an oxide film. Selective deposition of metal film on the structure forms electrodes and electrically conducting paths on top of the PECVD oxide film so that the PECVD oxide film separates the electrodes from the silicon substrate. In this SCREAM process, electrical isolation of the electrodes is achieved by depositing the metal film only on the top and the side surfaces of microelectromechanical structures that are covered by the PECVD oxide film.

The SCREAM isolation process has the advantage of being relatively simple in not requiring separate photolithography and etching steps once the structure is fabricated using the SCREAM micromachining technique. On the other hand, the coverage achieved in the deposition of the metal film is generally poor and hence the SCREAM isolation process typically cannot be applied to tall structures having a high aspect ratio. It should be noted that, if a metal or other material is deposited that has good step coverage, such as metal films deposited by low pressure chemical vapor deposition (hereinafter, referred to as "LPCVD"), all electrodes and microelectromechanical parts are electrically connected, and hence, electrical isolation is not achieved.

FIGS. 2a–2f shows the silicon on oxide insulator (hereinafter, "SOI") wafer method, used in forming the microelectromechanical systems described in the following references: B. Diem, et al., "SOI(SIMOX) as a Substrate for Surface Micromachining of Single Crystalline Silicon Sensors and Actuators," *Tech. Dig. 7th Int. Conf. Solid-State Sensors and Actuators* (Transducers '93), Yokohama, Japan, 1993, pp. 233–236; and C. Marxer, et al., "Vertical Mirrors Fabricated by Deep Reactive Ion Etching for Fiber-Optic Switching Applications," *IEEE/ASME Journal of Microelectromechanical Systems*, Vol. 6, No. 3, pp. September 1997. In the SOI wafer method, the portion of the wafer on top of the buried oxide layer (hereinafter, the "device layer") is highly doped, conducting silicon. Since all structures and electrodes are fabricated in the device layer and are defined by etching the device layer down to the buried oxide layer, electrical isolation of the resulting electrodes is achieved automatically. On the other hand, SOI wafers are generally expensive and the residual stress created by the buried oxide layer can warp and change the shape of microelectromechanical structures made on the surface layer. In addition, the micromachined portions of the device layer silicon near the oxide interface can have roughened features (produced by the "footing" effect) when the structures and electrodes are formed in a deep plasma etching process. Another disadvantage of the SOI process is that the as-manufactured wafer has an established thickness of the oxide film and the device layer and these thicknesses cannot be modified once a wafer is manufactured.

FIG. 3 shows a scanning electron microscope (SEM) photograph of a micromachined comb-drive structure fabricated from single crystal silicon. The electrodes of the illustrated comb-drive structure are isolated using the junction isolation method. The junction isolation method is described, for example, in S. Lee, S. Park and D. Cho, "The Surface/Bulk Micromachining (SBM) Process: A New Method for Fabricating Released Microelectromechanical Systems in Single Crystal Silicon," *IEEE/ASME J. Microelectromechanical Systems*, Vol. 8, No. 4, December 1999. The junction isolation method forms a junction diode on a lightly doped N-type or P-type wafer. Applying a reverse biased voltage to the junction diode isolates the junction electrode from the substrate. Referring to FIG. 3, the silicon substrate is lightly doped P-type and the lighter parts, including the comb-drive structure, are highly doped N-type with phosphorus, so that a PN junction between the silicon substrate (P-type) and the electrode (N-type) is formed. In this case, if a reverse bias voltage is applied to the PN junction, the electrodes are electrically isolated from the silicon substrate. This method has the advantage that the isolation steps are done before the micromechanical structure is fabricated, so that the structure can be fabricated in a relatively easy manner and with relatively little of the stress created by the isolation method. On the other hand, the method has disadvantage that the depth of the PN junction often cannot be made sufficiently deep, so that this process usually is not readily applied to a tall structure having a high aspect ratio.

FIG. 4 is a structure formed by yet another conventional isolation method, the trench oxide isolation method, described in the following references: U.S. Pat. No. 5,930,595; U. Sridhar et al., "Trench Oxide Isolated Single Crystal Silicon Micromachined Accelerometer," *IEEE IEDM*, San Francisco Calif., Dec. 6–9, 1998. pp. 475–478; and S. Lee, S. Park, D. Cho and Y. Oh "Surface/Bulk Micromachining (SBM) Process and Deep Trench Oxide Isolation Method for MEMS", *IEEE IEDM*, Washington, D.C., Dec. 5–8, 1999. pp. 701–704. This trench isolation method includes forming U-shaped trenches 14 on a silicon substrate 16, forming thermal oxide layers 18 and depositing oxide layers 20 on all sides of the structure where the trenches are formed. The oxide films 18, 20 filling the trenches attach the electrode structures 22, 24 to the silicon substrate 16 through the respective sidewalls so that the oxide films support the electrodes and tethered structures. The oxide films electrically isolate the electrodes from each other and from the substrate.

This trench isolation method has the advantage that the method can be applied to a tall structure having a high aspect ratio. On the other hand, separate photolithography and etching steps are required to form a metal layer on the electrode to allow wire bonding the electrode to a package. Two different release processes are required: one to separate the electrode component from the substrate and a second to separate the structure part from the substrate. The trenches between the sidewalls of the electrode and the sidewalls of the substrate generally cannot be made arbitrarily large, as would be desired to achieve a small parasitic capacitance, without sacrificing the structural rigidity of the trench filled oxide layers that support the structure and electrodes. Additionally, the conventional trench isolation method deposits the insulation layers on the sides of the electrode to support the structure and electrodes. Therefore, the electrode and the substrate need to be supported by means other than the insulating layers during manufacturing, which limits the electrode shapes that can be made. In particular, it is difficult to fabricate an electrode in an "island" shape or in a complicated electrode arrangement like that used in an angular velocimeter. Those skilled in the art can appreciate the need for a simpler isolation method.

SUMMARY OF THE PREFERRED EMBODIMENTS

Accordingly, the present invention is directed to an isolation method for a microstructure that provides effective isolation in a range of applications.

An aspect of the present invention provides a method for forming an electrode in a micromachined structure. The method includes providing a microstructure comprising silicon, the microstructure having at least one released surface opposite and spaced from an underlying surface of a substrate comprising silicon. An insulation layer is formed over surfaces of the microstructure, including over the released surface, a conductive layer is formed over surfaces of the insulation layer, and a metal layer is formed over at least a top surface of the conductive layer on at least a portion of the microstructure.

Another preferred isolation method forms an insulation layer on the exposed surfaces of a microstructure after the microstructure has been formed by micromachining and released from the surface of an underlying substrate. The isolation method forms a conductive layer over the entire insulation layer and forms a metal layer over the conductive layer on top portions of the microstructure. Partially etching of the conductive layer forms electrical isolation between parts of the microstructure.

The conductive layer preferably may be a heavily-doped polycrystalline silicon layer having good step coverage formed by low pressure chemical vapor deposition ("LPCVD"). Etching of the conductive layer preferably may be accomplished by anisotropic dry etching. The insulation layer preferably may be a thermal oxide layer formed on the surface of a preferred single crystalline silicon by thermal oxidization. Alternatively, the insulation layer may be an oxide layer or a nitride layer formed by plasma enhanced chemical vapor deposition ("PECVD") or LPCVD having good step coverage, or a composite insulation layer of a thermal oxide layer, an LPCVD oxide layer, an LPVCD nitride layer, a PECVD oxide layer and/or a PECVD nitride layer. Other insulators are apparent.

Another aspect of the invention provides a silicon microstructure having released structures and a layer structure for electrically isolating portions of the silicon microstructure. The layer structure comprises an insulation layer formed over released surfaces of the silicon microstructure, a conductive layer formed over the insulation layer including over sidewalls of the released structures, conductive layer having gaps electrically isolating portions of the silicon microstructure, and a metal layer formed over portions of the released structures.

BRIEF DESCRIPTION OF THE DRAWINGS

Aspects and various advantages of the present invention are described below, with reference to the various views of the drawings, which form a part of this disclosure.

FIGS. 1a–1f illustrate a conventional SCREAM isolation process.

FIGS. 2a–2f illustrate a conventional isolation process employing a silicon on insulator ("SOI") wafer.

FIG. 3 shows scanning electron microscope ("SEM") photograph of a micromachined comb-drive structure employing a conventional junction isolation method.

FIG. 4 illustrates a conventional trench oxide isolation method.

FIGS. 5a–5g illustrate an isolation process employing a deep trench insulation layer.

FIGS. 6a–6e illustrate an isolation method according to an aspect of the present invention.

FIG. 8a is an SEM photograph showing an upper portion of a side wall of a trench of a microstructure in accordance with the process flow illustrated in FIG. 7.

FIG. 8b is an SEM photograph showing a lower portion of a side wall of a trench of a microstructure in accordance with the process flow illustrated in FIG. 7.

DETAILED DESCRIPTION OF THE PREFERRED EMBODIMENT

Figure 6C:
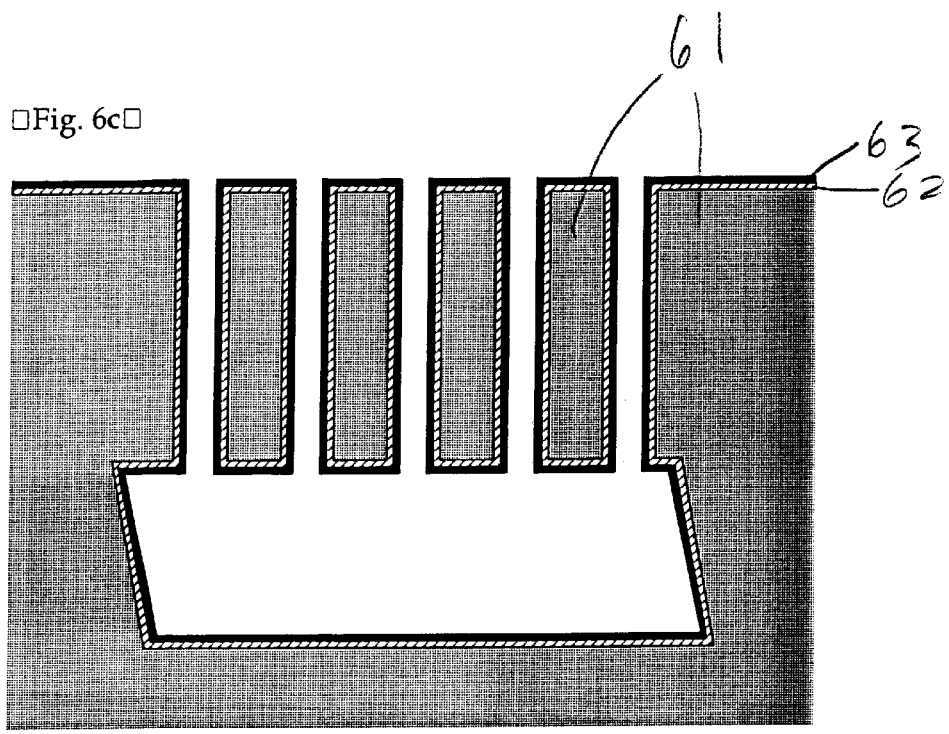

As discussed in the background, providing electrical isolation to portions of micromachined structures is important to the implementation of many microelectromechanical devices. Also as discussed in the background, it can be difficult to effectively achieve desirable isolation in a manner that is adaptable to a range of micromachined structures. Preferred configurations and techniques are described here for electrically isolating the operational surfaces of electrodes from the substrate in which the micromachined structures are formed. In particular, preferred implementations provide a structure in which a conducting surface layer is provided over and separate from an underlying micromachined structure. The conductive surface layer might, for example, include a doped layer of polycrystalline silicon ("polysilicon"), which might be separated from the underlying structure by a layer of highly insulating oxide. A metal layer is preferably deposited on the upper surface of the polysilicon layer to provide contacts. Most preferably, this metal layer also protects the top polysilicon layer in an anisotropic etch process that preferably is used to separate portions of the doped polysilicon layer.

Preferred implementations of the present invention will be described as applied to silicon microstructures formed using the surface/bulk micromachining techniques. It is to be understood that surface/bulk micromachining techniques are exemplary of the techniques that may be used in forming the microstructures on which the described isolation is formed. Other micromachining techniques are known and might well be used to produce the micromachined structures that are isolated. FIGS. 5a–5g illustrate aspects of a surface/bulk micromachining technique, as described in co-pending U.S. patent application Ser. No. 09/756,981, filed Jan. 9, 2001 and entitled "Isolation Micromachined Single Crystal Using Deep Trench Insulation," which patent application is hereby incorporated by reference in its entirety. This application describes an alternate strategy for electrically isolating microstructures. It should be noted that the present triple layer isolation can be used in conjunction with the isolation strategy described in the above-referenced surface/bulk micromachining application.

FIGS. 5a–5g show an isolation process employing a deep trench insulation layer. First, a trench deeper than the thickness of the electrode to be formed is etched at an intermediate position of the electrode to be formed on a single crystalline silicon substrate (FIG. 5b). The trench is filled with an insulation material such as silicon oxide (FIG. 5c). The moving structure and the electrode portion 51 are then released and separated from the silicon substrate. As shown in FIG. 5d, the oxide or other insulation is stripped from the surface of the silicon workpiece. The process then forms a mask on the surface of the workpiece establishing the lateral extents of the electrodes to be formed (FIG. 5e). Deep etching proceeds deeper than the height of the electrode. The sidewalls of the electrode are passivated and then the trenches are etched deeper to expose sidewalls beneath the electrodes. Lateral release etching is conducted to form the electrode structures shown in FIG. 5f. Finally, metal is sputtered over the electrodes to make them more conductive so that contacts can readily be formed (FIG. 5g).

The insulation layer 52 filled in the deep trench is fixed in the silicon substrate and supports the electrode portion from the interior of the electrode (see FIG. 5f). According to the process illustrated in FIGS. 5a–5g, the insulation material filled in the deep trench is fixed to the silicon substrate and passes through the interior of the electrode to support the electrode. Consequently, an insulation layer is not necessary on the side of the electrode. Therefore, electrodes having an "island" shape and separated from the silicon substrate on all sides can be formed. This process has the advantage that the metal layer is vapor-deposited on the electrode structure and the electrode structure is formed in a single release process. The metal layer can be formed without separate photolithography and etching processes. The process illustrated in FIGS. 5a–5g, however, cannot be applied to a microstructure having high aspect ratio features.

A triple layer isolation method for a single crystalline silicon microstructure according to preferred embodiments of the present invention is described with reference to the accompanying drawings. It should be appreciated that the term "triple layer" is used here for convenience and indicates that in a particularly preferred implementation, isolation and electrode definition forms three layers. More layers could of course be included. In addition, at least for some applications it is possible that the metal layers could be limited in extent so that considerable portions of the electrodes are not covered by metal. On the other hand, the triple layer embodiment is the presently contemplated and preferred implementation in that the metal layer covering top surfaces of the polysilicon conductive layer provides improved conductivity and uniformity of charge distribution.

In a preferred implementation, the triple layer electrode includes an insulation layer, a conductive layer and a metal layer formed on the single crystalline silicon microstructure. A partial etching is carried out on a predetermined portion of the conductive layer to achieve electrical isolation between parts of the silicon microstructure. Etching of the conductive layer may be carried out after all layers of the triple layer are formed. Alternatively, etching may be carried out after the insulation layer and the conductive layer are formed but before the metal layer is formed. In the latter case, the metal layer is subsequently formed to form the triple layer.

In preferred embodiments of the present invention, the insulation layer is a thermal oxide layer, the conductive layer is a thin, heavily-doped polycrystalline silicon layer, and the metal layer comprises aluminum. The heavily-doped polycrystalline silicon layer can be formed with excellent step coverage for narrow trenches, and can be formed on the entire surface of the silicon microstructure, making it suitable as the conductive layer in the isolation method of the present invention.

In on process flow according preferred aspects of the present invention, shown in FIGS. 6a to 6e, the conductive layer is etched before the metal layer is formed. In an alternate process flow shown in FIGS. 7a to 7e, the triple layer with the insulation layer, the conductive layer and the metal layer is formed before the conductive layer is etched.

FIG. 6a illustrates a single crystalline silicon microstructure 61 formed by known micromachining techniques such as a surface/bulk micromachining (SBM) process or other suitable processes. The surface/bulk micromachining process is described in the above-referenced patent application and in U.S. Pat. No. 6,150,275, entitled "Micromechanical System Fabrication Method Using (111) Single Crystalline Silicon." U.S. Pat. No. 6,150,275 is hereby incorporated by reference in its entirety as teaching a particularly preferred way of creating the microstructures isolated by the presently described method. The structure typically include released moving or non-moving beams or other structures 61a, trenches 61b, and sacrificial gaps 61c. Released refers to the fact that the lower surface of the beam or other structure is separated from the underlying substrate. The silicon microstructures typically include high aspect ratio features and narrow gaps between parts of electrodes or structures. The methods described here can be suitably applied to isolate microstructures having high aspect ratio features.

Figure 6D:
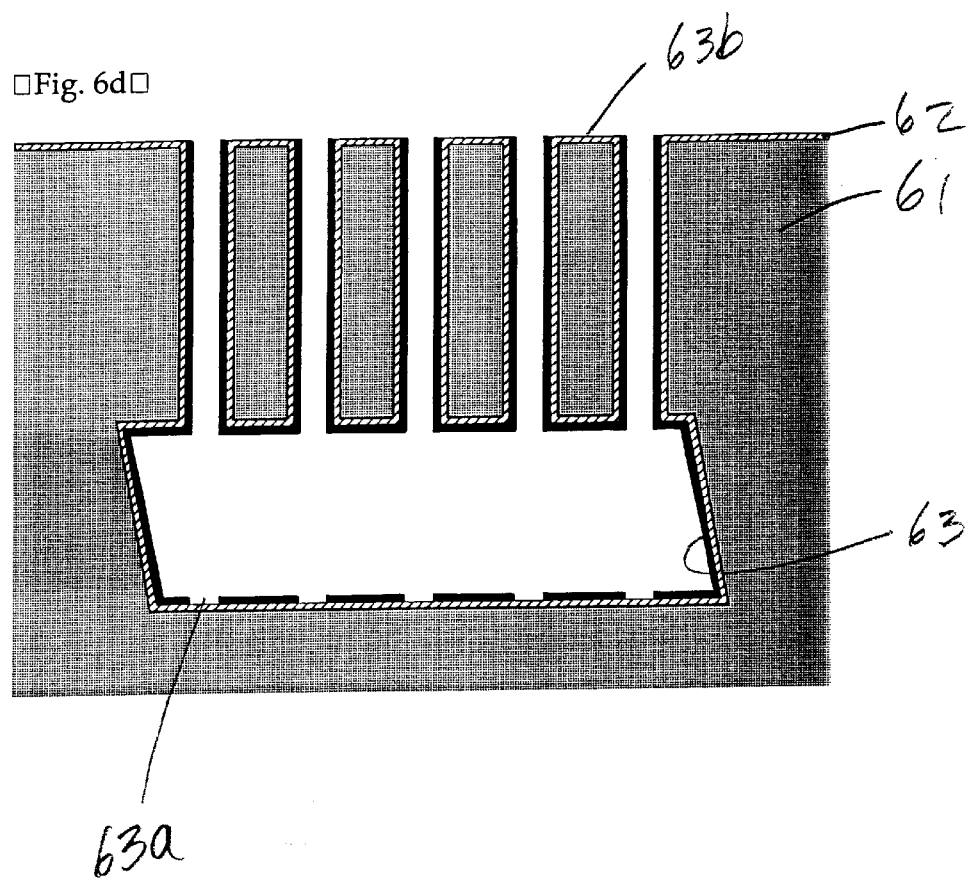
Figure 6E:
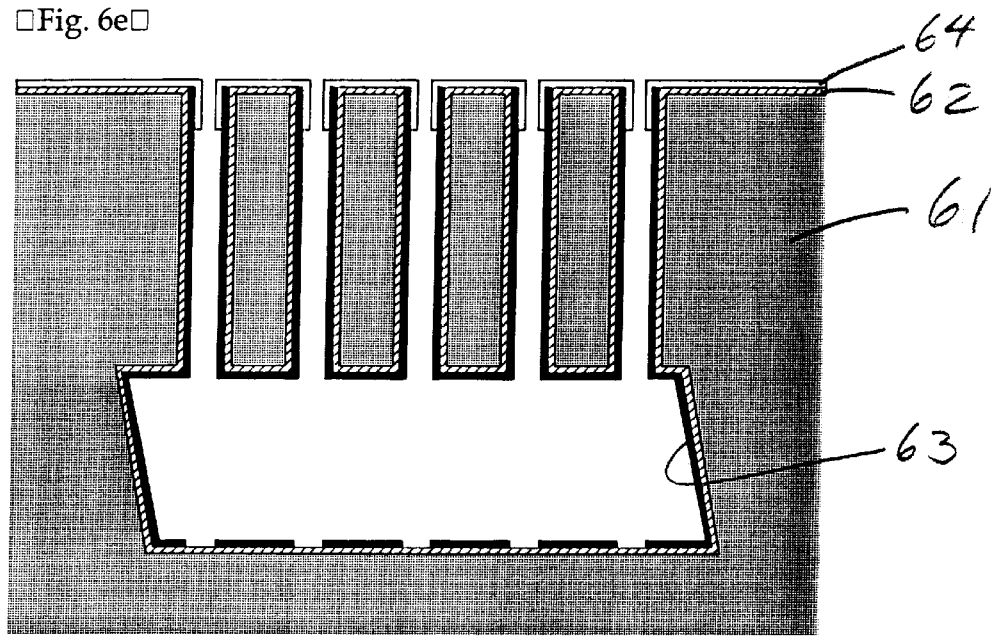

In the isolation method illustrated in FIGS. 6I–6e, the silicon microstructure 61 is first subject to a thermal oxidizing process to form a thermal oxide layer 62 on the exposed surfaces of the microstructure (FIG. 6b). Thermal oxidation is particularly preferred for forming uniform, dense oxide layers that provide excellent insulation with very thin films. Next, a thin, heavily-doped polysilicon layer 63 is evenly formed on the surfaces of the thermal oxide layer 62 using low pressure chemical vapor deposition ("LPCVD") (FIG. 6c). Note that the LPCVD polysilicon layer can be deposited with a high level of dopants. Alternately the LPCVD polysilicon layer can be deposited undoped or lightly doped and further doping performed by diffusion. Also note that, while LPCVD is particularly preferred for its effective step coverage, some variations in LPCVD processing are acceptable while still obtaining good step coverage and uniform high quality films. Due to the excellent step coverage characteristics of the LPCVD polysilicon layer 63, the layer can be evenly formed in deep trench structures having relatively narrow widths. The uniformity and conductivity of the polysilicon layer 63 formed on the side walls of the trenches allows the released structures to be used as electrodes. The conductive layer 63 is electrically isolated from the released silicon beam or structure 61 a by the thermal oxide layer 62.

The LPCVD polysilicon layer 63 is then subject to an anisotropic dry etching process to remove portions 63a of the polysilicon deposited on the bottom of the sacrificial gap 61e to isolate the electrodes (FIG. 6d). The polysilicon layer 63b over the top surface of the microstructure is etched at the same time, while the polycrystalline silicon layer on the side walls of the trenches remains to serve as the electrode later.

Finally, a metal layer 64 is formed by sputtering or evaporation to form electrode contacts (FIG. 6e). Aluminum is a particularly well suited metal because appropriate deposition methods are readily available and because aluminum and aluminum processing are inexpensive. The metal layer 64 is preferably deposited in a process that exhibits poor step coverage so that the metal layer is formed only over the top surface and upper portions of the side walls of the microstructure 61. As a result, electrical isolation between parts of the microstructure is preserved. If the widths of the trenches are sufficiently large, however, the metal layer 64 may be deposited on the bottom surface of the sacrificial gap (not shown), which may electrically connect portions of the structure that are desirably isolated. It is therefore preferable to use metal deposition methods and equipment that give poor step coverage.

As noted above, in the process flow illustrated in FIGS. 6a–6e, the conductive layer (polysilicon) 63 is etched after forming the insulation layer (thermal oxide) 62 and the conductive layer 63, but before forming the metal layer (aluminum) 64. In this case, the polysilicon layer 63 on the top surface of the microstructure 61 is etched away as shown in FIG. 6d, and only the metal layer 64 and the insulation layer 62 remain over the top surface. The polysilicon layer that is vapor-deposited on the side walls of the trenches remains to serve as electrodes. This is acceptable because the metal layer extends sufficiently onto the polysilicon sidewalls to make good contact.

Figure 7A:
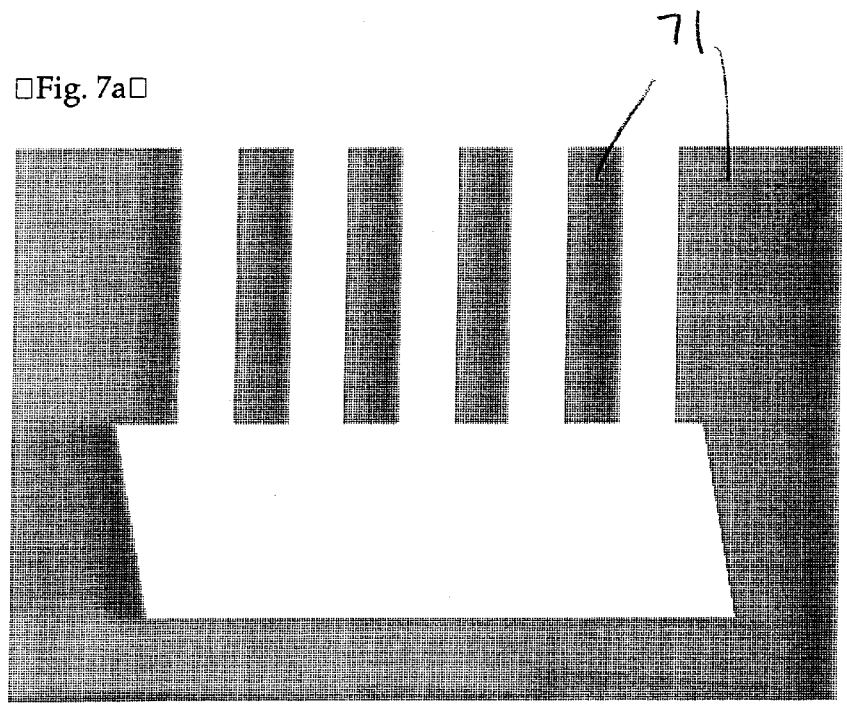
FIGS. 7a–7e illustrate another isolation method according to the present invention.
Figure 7B:
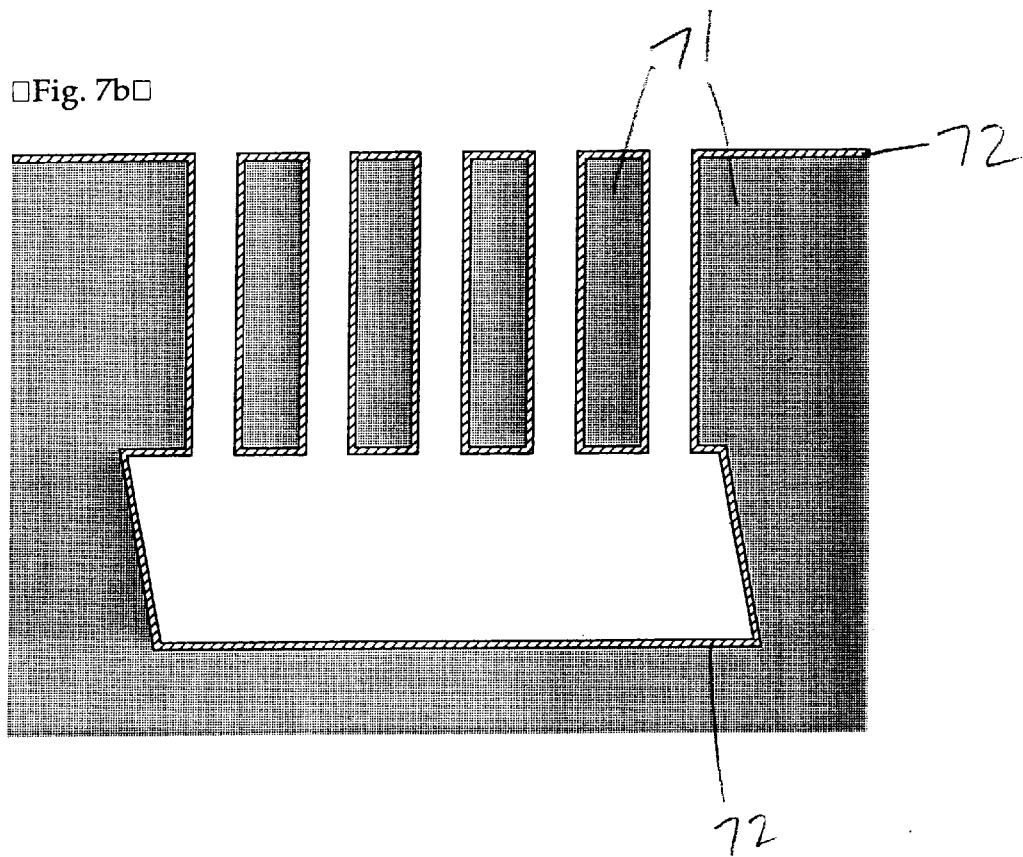
Figure 7C:
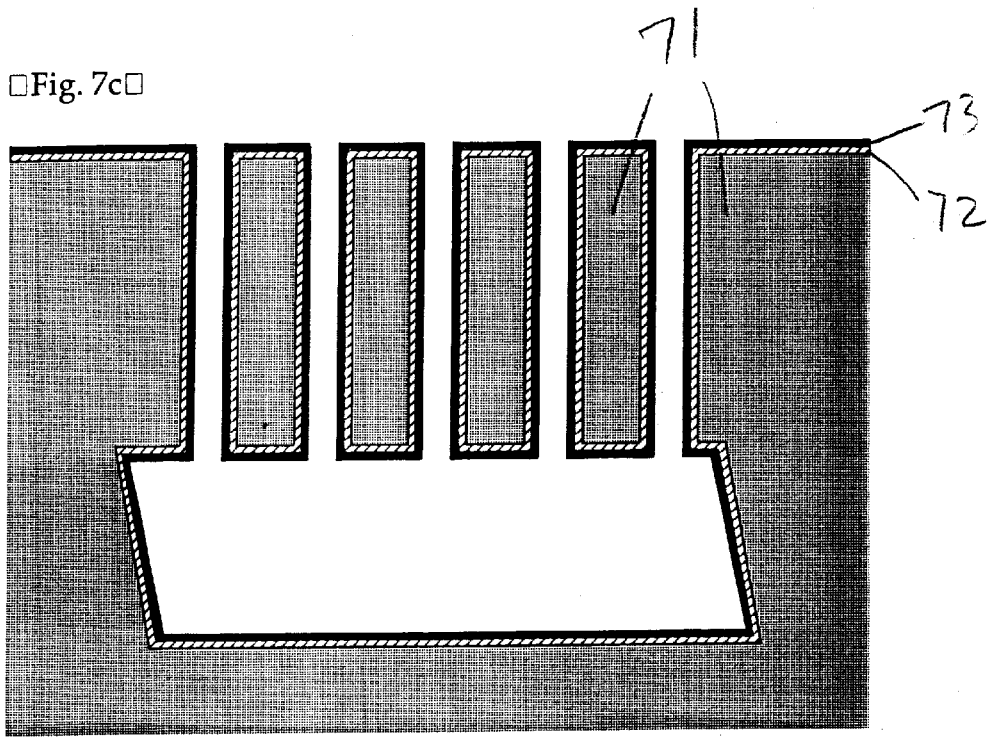

FIGS. 7a to 7e show a different process flow for a triple layer isolation method, in which the triple layer including the insulation layer, the conductive layer and the metal layer is formed, and the conductive layer is subsequently etched. First, the single crystalline silicon microstructure 71 (FIG. 7a) is subjected to a thermal oxidizing process to form a thermal oxide layer 72 on the exposed surfaces of the microstructure 71 (FIG. 7b). Next, a thin, heavily-doped polycrystalline silicon layer 73 is evenly formed over the entire thermal oxide layer 72 using LPCVD (FIG. 7c). Due to the excellent step coverage of the LPCVD polycrystalline silicon layer 73, the layer can be evenly formed in deep trench structures having relatively narrow widths. In particular, the polycrystalline silicon layer 73 formed on the side walls of the trenches allows the released structures to be used as electrodes. The conductive layer 73 is electrically isolated from the silicon substrate 71 by the thermal oxide layer 72.

Figure 7D:
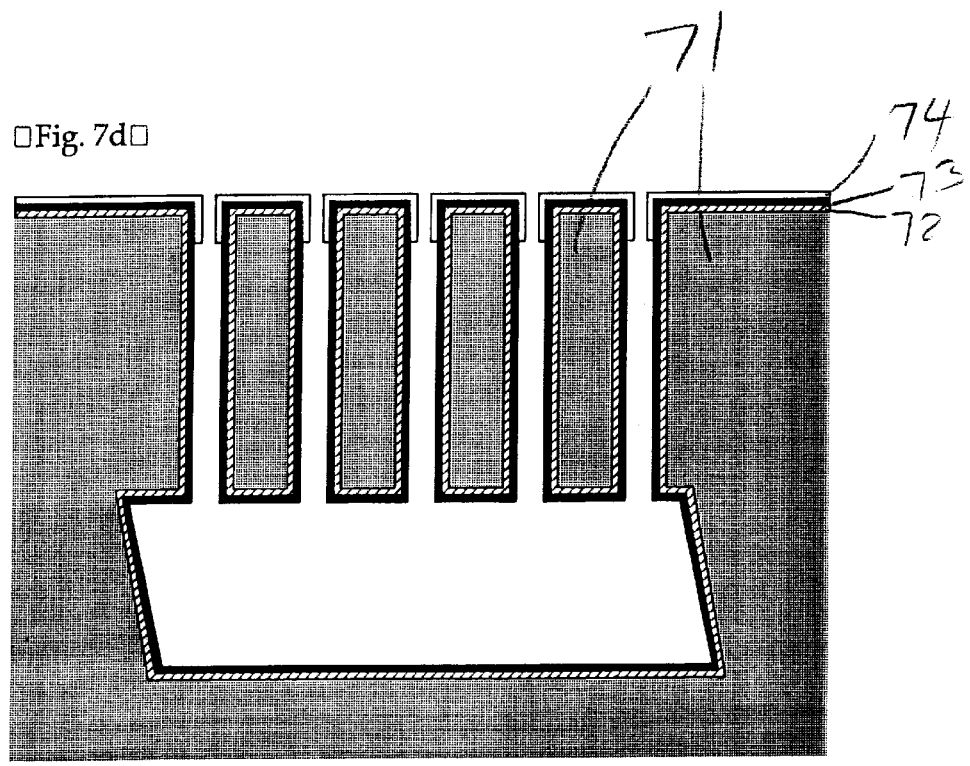
Figure 7E:
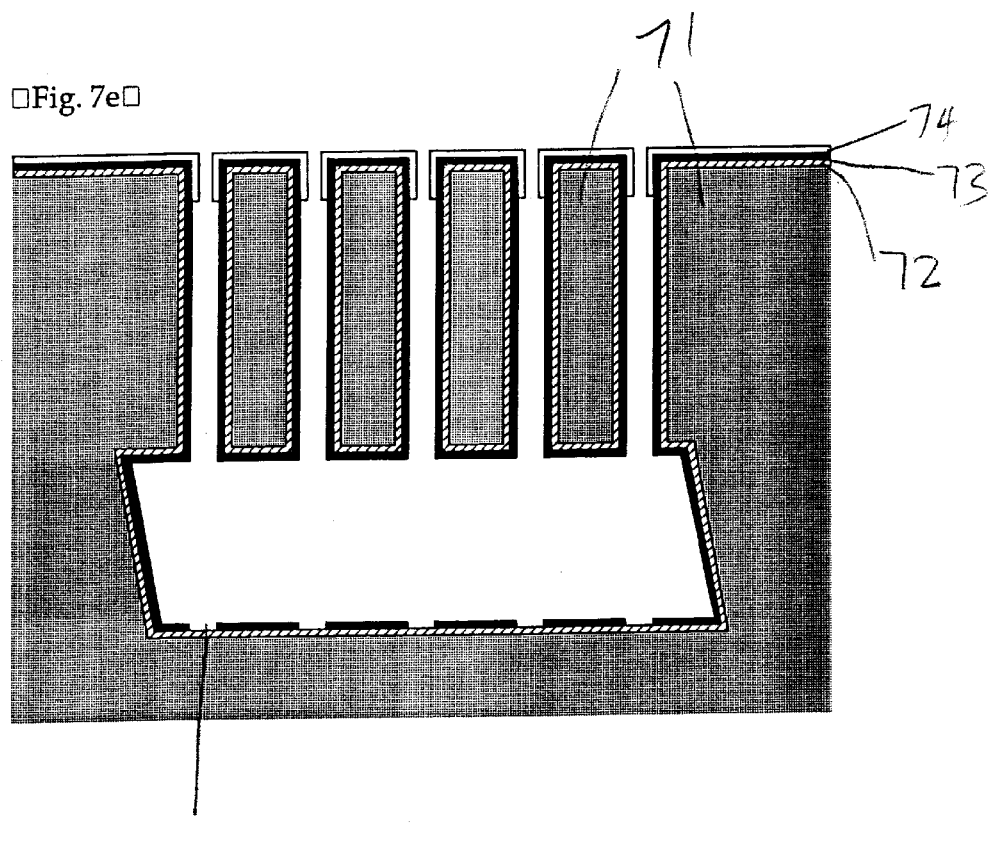

After the LPCVD polycrystalline silicon deposition, an aluminum or other metal layer 74 is formed by sputtering or evaporation to form electrode contacts (FIG. 7d). The metal layer 74 exhibits poor step coverage, and is formed only over the top surface and upper portions of the side walls of the microstructure 71. As a result, electrical isolation between parts of the microstructure is not affected by the metal layer. Subsequently, the polycrystalline silicon layer 73 is subjected to an anisotropic dry etching process to remove a part 73a of the polycrystalline silicon deposited on the bottom surface of the sacrificial gap to achieve isolation of the electrodes (FIG. 7e). In this etching process, the metal layer acts as a mask and the etch gas composition in the anisotropic etching is chosen accordingly, as is known in the art.

As noted above, in the process flow illustrated in FIGS. 7a–7e, the triple layer including the insulation layer (thermal oxide) 72, the conductive layer (polycrystalline silicon) 73 and the metal layer (aluminum) 74 is formed before the conductive layer 73 is etched. As a result, the polycrystalline silicon layer 73 remains on the top surface of the microstructure 61.

Although a thermal oxide layer is described as the insulation layer in the above embodiments, the insulation layer may also be an oxide layer or a nitride layer formed by PECVD or LPCVD having good step coverage, or a composite insulation layer of a thermal oxide layer, an LPCVD oxide layer, an LPVCD nitride layer, a PECVD oxide layer and/or a PECVD nitride layer.

FIGS. 8a and 8b are SEM photographs showing an upper and a lower portion, respectively, of a released beam of a microstructure fabricated in accordance with the process flow illustrated in FIGS. 7a–7e. In FIGS. 8a and 8b, the thickness of the released beam is 40 μm, the gap provided by trench between the beams is 8 μm, and the thicknesses of the thermal oxide layer, the polycrystalline silicon layer and the aluminum layer of the triple layer are 0.12 μm, 0.18 μm and 0.35 μm, respectively. From FIG. 8a, it can be observed that the aluminum layer, the polycrystalline silicon layer and the oxide layer are formed on the top surface of the microstructure, and that the aluminum layer is formed over several μm of the side walls from the top, but is not formed below that depth. From FIG. 8b, it can be observed that the polycrystalline silicon layer and the oxide layer are evenly formed over the surface of the microstructure including the underside or released surface of the released beam.

Figure 9:
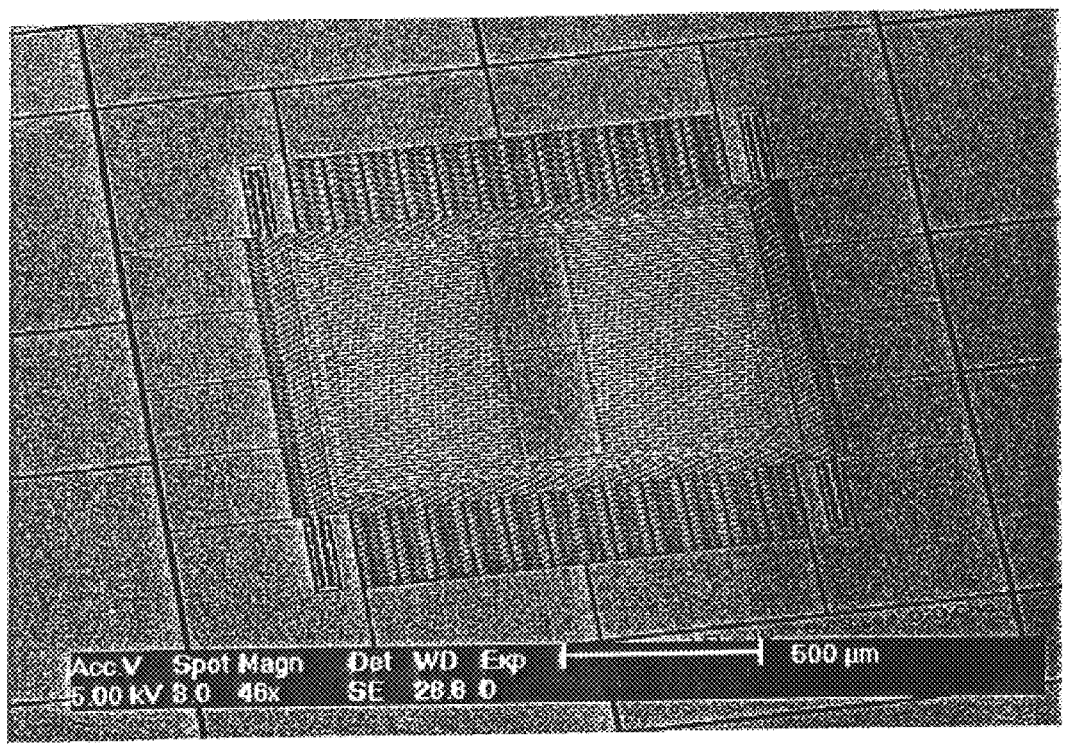
FIG. 9 is an SEM photograph showing a micro angular rate gyroscope isolated according to the described methods.

The isolation method for the single crystalline silicon microstructure according to preferred embodiments of the present invention can be applied to effectively isolate parts of a microstructure from each other in, for example, a micro accelerometer or angular rate gyroscope where a driving part and a detecting part are separated. FIG. 9 is an SEM photograph showing a micro angular velocimeter to which an isolation method according to embodiments of the present invention is applied.

As set forth above, the triple layer isolation method for a single crystalline silicon microstructure according to the present invention does not require a separate photolithography process for isolation, and is effectively applicable to microstructures having high aspect ratio features and narrow trenches. Further, because the insulation layer and the conductive layer formed in the isolation step cover the side walls of the trenches after formation of the silicon microstructure, structures having smaller trench widths than in the as-formed silicon microstructure can be obtained. In addition, since the ithicknesses of the insulation layer and the conductive layer can be adjusted, in cases where the insulation layer and the conductive layer are formed in a driving electrode or a sensing electrode, the capacitance of the structure can be adjusted. Likewise, in cases where these layers are formed in a movable spring, the thickness of the spring, and consequently the spring constant and the resonance frequency of the structure, can be adjusted.

It will be apparent to those skilled in the art that various modifications and variations can be made in the triple film isolation method of the present invention without departing from the spirit or scope of the invention. Thus, it is intended that the present invention cover modifications and variations that come within the scope of the appended claims and their equivalents.

What is claimed is:

1. A method for forming an electrode in a micromachined structure, the method comprising:
    providing a microstructure comprising silicon, the microstructure having at least one released surface opposite and spaced from an underlying surface of a substrate comprising silicon;
    forming an insulation layer over surfaces of the microstructure, including over the released surface;
    forming a conductive layer over surfaces of the insulation layer; and
    forming a metal layer over at least a top surface of the conductive layer on at least a portion of the microstructure.

2. The method of claim 1, wherein the insulation layer comprises oxide and the conductive layer comprises doped LPCVD polysilicon.

3. The method of claim 1, wherein the forming the insulation layer comprises thermal oxidation and the forming a conductive layer comprises LPCVD of polysilicon.

4. The method of claim 1, wherein the conductive layer comprises doped polysilicon, the method further comprising anisotropically etching the doped polysilicon prior to forming the metal layer.

5. The method of claim 1, wherein the conductive layer comprises doped polysilicon, the method further comprising etching the doped polysilicon using the metal layer as a mask.

6. The method of claim 1, wherein the microstructure comprises first and second beams having a rectangular cross section, the first and second beams each having a released surface opposite and spaced from a substrate, the first beam having a first side surface opposite and spaced from a second side surface of the second beam, the first side covered by the insulation layer and by the conductive layer and the second side covered by the insulation layer and by the conductive layer, the metal layer present on an upper portion of the first side and not present on a lower portion of the first side, and the metal layer present on an upper portion of the second side and not present on a lower portion of the second side.

7. The method of claim 6, wherein the metal layer comprises aluminum.

8. The method of claim 7, wherein the forming the metal layer comprises sputtering.

9. The method of claim 6, wherein the conductive layer comprises doped polysilicon, the method further comprising anisotropically etching the doped polysilicon prior to forming the metal layer.

10. The method of claim 9, wherein the insulation layer comprises oxide and the conductive layer comprises doped LPCVD polysilicon.

11. The method of claim 9, wherein the forming the insulation layer comprises thermal oxidation and the forming a conductive layer comprises LPCVD of polysilicon.

12. The method of claim 6, wherein the conductive layer comprises doped polysilicon, the method further comprising etching the doped polysilicon using the metal layer as a mask.

13. The method of claim 12, wherein the insulation layer comprises oxide and the conductive layer comprises doped LPCVD polysilicon.

14. The method of claim 12, wherein the forming the insulation layer comprises thermal oxidation and the forming a conductive layer comprises LPCVD of polysilicon.

15. An isolation method for a silicon microstructure, comprising:
    forming an insulation layer over an exposed surface of the silicon microstructure;
    forming a conductive layer over the exposed insulation layer;
    forming a metal layer over top portions of the microstructure; and
    partially etching the conductive layer to form electrical isolation between parts of the microstructure.

16. The isolation method of claim 15, wherein the insulation layer contains one or more layers selected from the group consisting of a thermal oxide layer formed by thermal oxidization of the single crystalline silicon, a PECVD oxide layer, an LPCVD oxide layer, a PECVD nitride layer, and an LPCVD nitride layer.

17. The isolation method of claim 15, wherein the conductive layer is a heavily-doped polycrystalline silicon layer.

18. The isolation method of claim 17, wherein the heavily-doped polycrystalline silicon thin layer is formed by chemical vapor deposition.

19. The isolation method of claim 15, wherein the partial etching of the conductive layer is performed by an anisotropic dry etching process.

20. The isolation method of claim 15, wherein the partial etching of the conductive layer is performed before the metal layer is formed.

21. The isolation method of claim 15, wherein the partial etching of the conductive layer is performed after the metal layer is formed.

* * * * *